(12) United States Patent
Grimes et al.

(10) Patent No.: US 8,835,285 B2
(45) Date of Patent: Sep. 16, 2014

(54) METHODS TO FABRICATE VERTICALLY ORIENTED ANATASE NANOWIRE ARRAYS ON TRANSPARENT CONDUCTIVE SUBSTRATES AND APPLICATIONS THEREOF

(75) Inventors: Craig A. Grimes, Raleigh, NC (US); Xinjian Feng, Suzhou Industrial Park (CN); Kevin E. Kreisler, Raleigh, NC (US)

(73) Assignee: Flux Photon Corporation, Bethlehem, PA (US)

( * ) Notice: Subject to any disclaimer, the term of this patent is extended or adjusted under 35 U.S.C. 154(b) by 0 days.

(21) Appl. No.: 13/590,786

(22) Filed: Aug. 21, 2012

(65) Prior Publication Data

US 2013/0048947 A1    Feb. 28, 2013

Related U.S. Application Data

(60) Provisional application No. 61/525,926, filed on Aug. 22, 2011.

(51) Int. Cl.
*H01L 21/20* (2006.01)
*H01L 21/36* (2006.01)

(52) U.S. Cl.
USPC .............. 438/478; 257/E21.09; 257/E29.168; 438/962

(58) Field of Classification Search
USPC .............. 257/E21.09, E29.168; 438/478, 962
See application file for complete search history.

(56) References Cited

U.S. PATENT DOCUMENTS

| | | | |
|---|---|---|---|
| 7,553,371 B2 | 6/2009 | Dubrow et al. | |
| 2001/0054549 A1 | 12/2001 | Park et al. | |
| 2008/0261112 A1 | 10/2008 | Nagata et al. | |
| 2008/0318044 A1 | 12/2008 | Tian et al. | |
| 2009/0117028 A1 | 5/2009 | Kundu | |
| 2009/0214942 A1 | 8/2009 | Frank et al. | |
| 2009/0311513 A1 | 12/2009 | Hu et al. | |
| 2010/0139772 A1 | 6/2010 | Frank et al. | |
| 2010/0187172 A1 | 7/2010 | Paulose et al. | |
| 2010/0269270 A1* | 10/2010 | Ma et al. | ............. 8/495 |
| 2010/0269894 A1 | 10/2010 | Misra et al. | |
| 2010/0284902 A1 | 11/2010 | Morgado Junior et al. | |
| 2011/0079275 A1 | 4/2011 | Qiao et al. | |
| 2013/0017145 A1* | 1/2013 | Sunkara et al. | ............. 423/592.1 |

OTHER PUBLICATIONS

Chung et al., "Rapid Synthesis of Titania Nanowires by Microwave—Assisted Hydrothermal Treatments." Ind. Eng. Chem. Res., vol. 47, p. 2301-2307 (2008).*

* cited by examiner

*Primary Examiner* — Asok K Sarkar
(74) *Attorney, Agent, or Firm* — Porzio, Bromberg & Newman, P.C.

(57) ABSTRACT

The present invention relates to growth of vertically-oriented crystalline nanowire arrays upon a transparent conductive or other substrate for use in $3^{rd}$ generation photovoltaic and other applications. A method of growing crystalline anatase nanowires includes the steps of: deposition of titania onto a substrate; conversion of the titania into titanate nanowires; and, treatment of the titanate nanowires to produce crystalline anatase nanowires.

42 Claims, 7 Drawing Sheets

METHODS TO FABRICATE VERTICALLY ORIENTED ANATASE NANOWIRE ARRAYS ON TRANSPARENT CONDUCTIVE SUBSTRATES AND APPLICATIONS THEREOF

CROSS REFERENCE TO RELATED APPLICATION

This application claims the benefit of U.S. Provisional Patent Application No. 61/525,926, filed Aug. 22, 2011, the entirety of which is hereby incorporated by reference into this application.

FIELD OF THE INVENTION

The present invention generally relates to fabrication of crystalline anatase nanowire arrays vertically oriented from a substrate. More specifically, the invention relates to fabrication of the nanowire arrays on transparent conductive substrates for use within various applications, such as in photovoltaic, catalytic, and energy storage devices.

BACKGROUND OF THE INVENTION

Third generation photovoltaics encompass a variety of designs including liquid-based dye sensitized Grätzel solar cells ("DSSCs"), heterojunction solar cells, Förster resonance energy transfer ("FRET") based solar cells, and organic solar cells. Liquid-based DSSCs utilizing a dye-coated layer of $TiO_2$ nanoparticles have reached photoconversion efficiencies of over 11%, as described in M. K. Nazeeruddin, F. De Angelis, S. Fantacci, A. Selloni, G. Viscardi, P. Liska, *Combined Experimental and DFT-TDDFT Computational Study of Photoelectrochemical Cell Ruthenium Sensitizers*, J. Am. Chem. Soc. 2005, 127, 16835-16847. Solid-state organic solar cells are easy to handle and manufacture, and have demonstrated efficiencies ranging from 2 to 8.13%, as described in S. H. Park, A. Roy, S. Beaupré, S. Cho, N. Coates, J. S. Moon, D. Moses, M. Leclerc, K. Lee, A. J. Heeger, *Bulk heterojunction solar cells with internal quantum efficiency approaching 100%*, Nature Photonics 3 (2009) 297-302. Another third generation photovoltaic technology is quantum dot ("QD") that has reached photoconversion efficiencies of approximately 5%, as described in X. Wang, G. I. Koleilat, J. Tang, H. Liu, I. J. Kramer, R. Debnath, L. Brzozowski, D. A. R. Barkhouse, L. Levina, S. Hoogland, E. H. Sargent, *Tandem colloidal quantum dot solar cells employing a graded recombination layer*, Nature Photonics 5 (2011) 480-484. It is expected that photovoltaics utilizing multiple exciton generation ("MEG") can be achieved with photoconversion efficiencies of over 30%, as described in A. Luque, A. Marti, A. J. Nozik, *Solar cells based on quantum dots: Multiple exciton generation and intermediate bands*, MRS Bulletin 32 (2007) 236-241.

For all such $3^{rd}$ generation applications, cell designs that allow the direction of light absorption to be orthogonal to the direction of charge separation would offer significantly improved performance. Moreover, light absorption can be increased as desired without a penalty in charge recombination if such cells are comprised of crystalline structural elements that facilitate charge transfer, since the crystalline structures, in particular crystalline anatase $TiO_2$, rapidly transport the charge to the underlying electrical contact without unwanted recombination of the photogenerated charge. Thus, for integration into DSSC, QD, MEG and other third generation photovoltaic designs, single-crystal 1-D anatase material architectures that are vertically oriented from a transparent conductive layer integral to an underlying glass substrate are desirable.

Most common transparent conductive layers are made of a transparent conductive oxide ("TCO") such as tin oxide ("$SnO_2$"), indium tin oxide ("ITO") or fluorine-doped $SnO_2$ ("FTO"). Self-organized $TiO_2$ nanowire/nanotube arrays vertically oriented on a TCO substrate have been described and offer numerous benefits, such as large surface area for dye sensitization, resulting in enhanced light harvesting, easy transfer of electrons injected from photon-excited dye, vectorial (directed) charge transport to the electrical contact, and a readily assessable space for intercalation of the redox electrolyte or p-type semiconductor. However, while self-assembled vertically oriented 1-D titania nanoarchitectured films offer great potential for enhancing third generation photovoltaic efficiencies, to date such films have not been achieved. Something is always lacking in such fields, be it poor crystallinity of the electron transporting backbone, which results in poor charge transport; the wrong material phase, for example, rutile instead of anatase; damage to the transparent conductive oxide coating, which increases the series resistance and/or reduces film transmission; or low surface area, which limits the amount of light that can be absorbed.

The fabrication of polycrystalline anatase $TiO_2$ nanotube arrays on FTO-coated glass of desired pore size and length by anodic oxidation of a sputter-deposited Ti film, has been described in G. K. Mor, O. K. Varghese, M. Paulose, and C. A. Grimes, *Transparent Highly-ordered $TiO_2$ Nanotube-arrays via Anodization of Titanium Thin Films*, Advanced Functional Materials 15 (2005) 1291-1296. Fabrication of TiO2 nanotube arrays on FTO-coated glass up to 53 μm in length have been achieved, as described in O. K. Varghese, M. Paulose, C. A. Grimes, *Long vertically aligned titania nanotubes on transparent conducting oxide for highly efficient solar cells*, Nature Nanotechnology 4 (2009) 592-597. The as-anodized nanotubes are amorphous. They are crystallized by annealing in oxygen at elevated temperatures; the walls of crystallized nanotubes are anatase, while any residual Ti layer underneath the nanotubes will convert to rutile, as described in Varghese, O. K.; Gong, D. W.; Paulose, M.; Grimes, C. A; Dickey E. C., *Crystallization and high-temperature structural stability of titanium oxide nanotube arrays*, J. Mater Res 18 (2003) 156-165; and, M. Paulose, K. Shankar, H. Prakasam, S. Yoriya, O. K. Varghese, C. A. Grimes, *Fabrication Of Highly-Ordered $TiO_2$ Nanotube-Arrays of Great Length*, U.S. patent application Ser. No. 16/693,123, filed Jul. 26, 2007. $TiO_2$ nanotube arrays grown on FTO glass need to be annealed at relatively low temperatures, no more than ≈470° C., to minimize damage to the FTO layer, as described in Varghese et al. Annealing promotes diffusion of residual Ti atoms into the FTO layer and, perhaps, fluorine into the $TiO_2$ layer, with a corresponding loss in electrical conductivity. The low annealing temperature prevents oxidation of residual Ti atoms, so film transparency suffers in progressively longer nanotube array films. Further, the closed end of the tubes makes it difficult to fill them with a viscous polymer. Thus while the nanotube arrays were of great scientific interest they did not transform third generation photovoltaics since the films were difficult to make, and faced a trade-off of poor crystallization or high series resistance.

The hydrothermal growth of vertically aligned $TiO_2$ single-crystal rutile nanowire films on FTO-coated glass, has been described in X. Feng, K. Shankar, O. K. Varghese, M. Paulose, T. J. Latempa, C. A. Grimes, *Vertically Aligned Single Crystal $TiO_2$ Nanowire Arrays Grown Directly on Transpar-* ent *Conducting Oxide Coated Glass: Synthesis Details and Applications, Nano Letters* 8 (2008) 3781-3786; and, X. Feng, Karthik Shankar, C. A. Grimes, *Single-Crystal Nanowires and Liquid Junction Solar Cells*, U.S. Patent Application No. 2010/0139747. The self-assembled hydrothermally grown nanowires are of a highly crystalline rutile structure with preferred [001] orientation. Nanowire length is increased by the use of extended hydrothermal reaction times, but extended reaction times may also result in a thicker oxide layer at the nanowire base reducing the surface area. Use of the rutile nanowires in DSSCs gave a relatively low photoconversion of approximately 5% for highly optimized devices. In comparison to rutile, use of anatase in DSSCs results in a higher photovoltage due to the higher conduction band level of anatase. Further, for equal degrees of crystallization the charge transport properties of anatase are superior to those of rutile. Therefore, to facilitate fabrication of high performance $3^{rd}$ generation photovoltaics, it is desirable to provide an improved photovoltaic application of self-assembled anatase $TiO_2$-based 1-D nanostructures.

In 1999, Kasuga et al. (T. Kasuga, M. Hiramatsu, A. Hoson, T. Sekino, K. Niihara, *Titania nanotubes prepared by chemical processing, Advanced Materials* 11 (1999) 1307-1311) reported the synthesis of needle-shaped (length ≈100 nm, diameter ≈8 nm) anatase $TiO_2$ nanotubes through the mixture of anatase or rutile powders with an aqueous solution of 5-10 M NaOH at 110° C. for 20 h. A centrifuge was used to separate the nanotube powder from the solution, which was then washed with deionized water and subsequently immersed in a 0.1 M HCl solution for substitution of the sodium ions with the hydrogen ions. The hydrogen protons were then removed as water vapor through a high temperature anneal resulting in the needle-shaped anatase nanotubes.

In 2004, Wang et al. (W. Wang, O. K. Varghese, M. Paulose, C. A Grimes, Q. Wang, and E. C. Dickey, *A Study on the Growth and Structure of $TiO_2$ Nanotubes, J. Materials Research* 19 (2004) 417-422) reported fabrication of randomly oriented single crystal anatase nanotubes, having diameters of 8 nm to 10 nm and lengths ranging from approximately 0.1 μm to 1 μm, from a NaOH solution in which anatase nanoparticles were dispersed. X-ray diffraction studies showed the structure of the as-prepared nanotubes to be the same as that of the starting anatase $TiO_2$ nanoparticles. In a typical synthesis, 2 g of anatase $TiO_2$ particles were added to a 150 mL 10 M NaOH aqueous solution. The specimen was transferred into a Pyrex beaker and statically heated in an oven at 180° C. for 30 h, with the volume of the aqueous solution maintained constant during the heat-treatment process by continual addition of 10 M NaOH solution. The anatase nanotubes could be deposited from solution onto TCO substrates for solar cell use, however, the random orientation of the nanotubes led to the same fundamental trade-off as nanoparticle layers, in that increased thickness for increased light absorption resulted in more charge recombination due to the random walk the photogenerated charge had to make from the nanotubes to the underlying electrical contact.

Ohsaki et al. (Y. Ohsaki, N. Masaki, T. Kitamura, Y. Wada, T. Okamoto, T. Sekino, K. Niihara, S. Yanagida, *Dye-sensitized $TiO_2$ nanotube solar cells: fabrication and electronic characterization, Phys. Chem. Chem. Phys.*, 7 (2005) 4157-4163) synthesized titania nanotubes following the method of Kasuga et al. using P25 $TiO_2$ powder (particle diameter 21 nm) as the starting material. Films of the resulting needle-shaped $TiO_2$ nanotubes were used as the photoanodes in several dye sensitized solar cells, synthesized by spreading a paste of the titania nanotubes upon a transparent conducting glass (fluorine-doped $SnO_2$) substrate. Although the nanotubes were randomly oriented within the photoanode layer, a significant improvement in device photoconversion efficiency was seen in comparison to devices in which the photoanode was comprised of a P25 nanoparticle film of equal thickness (7.1% versus 6.2%). Ohsaki et al. found the titania nanotube electrodes to have longer diffusion lengths and electron lifetimes than those of the P25 nanoparticle films. The longer electron lifetimes result in the titania nanotube devices having higher open circuit voltages, and hence higher photoconversion efficiencies.

A limitation of the technique described by Ohsaki et al. for dye sensitized solar cell fabrication is that the nanotubes comprising the photoelectrode are randomly oriented, so that charge transport within the photoelectrode layer is also, to a significant extent, randomly directed leading to unwanted recombination of the photogenerated charge and hence lower photoconversion, that is sunlight to electricity, efficiencies. Further, the titania nanotube layer comprising the photoelectrode is mechanically applied to the transparent conductive substrate rather than grown directly on the surface resulting in an unwanted series resistance.

Zhao et al. (Y. Zhao, U-H. Lee, M. Suh, Y-U. Kwon, *Synthesis and characterization of highly crystalline anatase nanowire arrays, Bull. Korean Chemical Society* 25 (2004) 1341-1345) teach synthesis of films comprised of highly ordered crystalline anatase nanowire array. As detailed by Zhao et al., in a typical procedure 0.2 g Ti powder (100 mesh) was added to a 20 mL Teflon vessel followed by addition of 15 mL 10 M NaOH and 1 mL $H_2O_2$ (35 wt %). The hydrothermal vessel was placed in a 220° C. oven for 48 h. The reaction produced mat-like films comprised of parallel-aligned sodium titanate nanowires. To convert the sodium titanate nanowires into anatase nanowires, the arrayed sodium titanate nanowire films were submerged into a 1.2 M HCl solution for ion exchange of $Na^+$ with $H^+$. The films were then washed with distilled water to remove the acid, then annealed at 500° C. for 3 h in air to produce pure anatase ($TiO_2$) phase nanowire array films. While there is some uncertainty to the phase of the sodium titanate nanowires, Zhao suggests the overall reactions can be expressed as:

Synthesis:

$$6Ti + 12H_2O_2 + 2NaOH \rightarrow Na_2Ti_6O_{13} \cdot xH_2O + 13H_2O \quad (1)$$

Proton exchange:

$$Na_2Ti_6O_{13} \cdot xH_2O + 2H^+ \rightarrow H_2Ti_6O_{13} \cdot x'H_2O \quad (2)$$

Thermal conversion:

$$H_2Ti_6O_{13} \cdot x'H_2O \rightarrow 6TiO_2 + (1+x')H_2O \quad (3)$$

Formation of the nanowire array films is intrinsic to the crystal chemistry of alkali titanates and their ion-exchange properties. A limitation of the work of Zhao et al. is that the synthesized nanowire array mats are free-standing, like a self-supporting membrane, rather than synthesized on a transparent conductive-coated glass substrate as needed to achieve a photovoltaic device.

Boercker et al. (J. E. Boercker, E. Enache-Pommer and E. S. Aydil, *Growth mechanism of titanium dioxide nanowires for dye-sensitized solar cells, Nanotechnology* 19 (2008) 095604) teach growth of randomly oriented polycrystalline anatase $TiO_2$ nanowire films from titanium foil substrates. First, the top surface of the titanium foil is transformed to $Na_2Ti_2O_4(OH)_2$ nanotubes, randomly oriented, through hydrothermal oxidation in a NaOH solution containing $H_2O_2$.

Next, the $Na_2Ti_2O_4(OH)_2$ nanotubes are converted to $H_2Ti_2O_4(OH)_2$ nanotubes by ion exchange through immersion of the sample in HCl for substitution of the $Na^+$ ions with $H^+$ ions. The $H_2Ti_2O_4(OH)_2$ nanotube samples are then annealed at elevated temperatures for conversion to polycrystalline anatase nanowires through a topotactic transformation. Boercker et al. describe that during annealing the sheets comprising the $H_2Ti_2O_4(OH)_2$ nanotubes, made of edge-bonded $TiO_6$ octahedra, dehydrate and form anatase crystals oriented along the nanotube axis which creates a polycrystalline nanowire.

As described in Boercker et al., $TiO_2$ nanowire films were synthesized in a typical procedure on titanium foil samples approximately 0.127 mm×2.5 cm×2.0 cm in size. The titanium foil samples were placed on the bottom of a 125 ml Teflon-lined hydrothermal pressure vessel with 60 ml 10 M NaOH and 4 ml 35 wt % $H_2O_2$. After heating the vessel at 220° C. for 4 h a film of sodium titanate nanotubes, approximately 7 μm thick, formed on the titanium foil surface in contact with the bottom of the vessel. The sample was removed from the vessel, washed with deionized water and dried under flowing Argon. To exchange the $Na^+$ ions with $H^+$ ions, the sample was immersed in 0.57 M HCl for 1 h transforming the sodium titanate nanotubes to hydrogen titanate nanotubes. The sample was removed from the HCl solution, rinsed with deionized water and then dried under flowing Argon. The sample was then heated at 500° C. for 1 h to convert the titanate nanotubes to anatase $TiO_2$ nanowires approximately 20 nm in diameter.

Boercker et al. describe synthesized nanowire films made upon an opaque titanium foil substrate. Such films can only be utilized under so-called 'back-side' illumination; in the case of dye sensitized solar cells this requires the incident light to pass through the redox electrolyte before reaching the dye layer where the electrical charge is generated. Since the redox electrolyte absorbs light without charge photogeneration, the resulting device photoconversion efficiencies are always significantly less than those devices illuminated through the electron-transporting $TiO_2$ layer. Further, high temperature annealing of the titanium sample, necessary for the topotactic transformation of the titanate nanotubes to anatase $TiO_2$ nanowires as described by Boercker et al., results in growth of an electrically resistive rutile barrier layer separating the nanowire film from the underlying titanium substrate. When integrated into a photovoltaic solar cell, this rutile barrier layer serves to increase the series resistance of the device in turn decreasing the device photoconversion efficiency. A further limitation is that the nanowires comprising the film are to a significant degree randomly-oriented so that, when used as a photoelectrode, charge transport will be correspondingly randomly directed leading to undesired recombination of the photogenerated charge and hence lower photoconversion efficiencies.

Liu et al. (B. Liu, J. E. Boercker, E. S. Adyil, *Oriented single crystalline titanium dioxide nanowires*, Nanotechnology 19 (2008) 505604) teach synthesis of single crystal anatase titanium dioxide nanowire array films vertically oriented from a titanium foil substrate. An array of single crystal sodium titanate ($Na_2Ti_2O_5.H_2O$) nanowires is grown on titanium foil through an alkali hydrothermal growth process. An ion-exchange step is used to convert the $Na_2Ti_2O_5.H_2O$ nanowires to protonated bi-titanate ($H_2Ti_2O_5.H_2O$) nanowires. A high temperature anneal is used to convert the protonated bi-titanate nanowires to single crystalline anatase $TiO_2$ nanowires through a topotactic transformation. Using this synthesis technique, Liu et al. obtained films comprised of an array of 2-50 μm long single crystal anatase nanowires, perpendicular to the titanium foil substrate, oriented in the [100] direction.

As described in Liu et al., a piece of titanium foil, approximately 0.127 mm×1.5 cm×3 cm in size, is ultrasonically cleaned for 0.5 h in a mixed solution of deionized water, acetone and 2-propanol with volume ratios of 1:1:1. The cleaned titanium sample is placed against the wall of a 125 ml Teflon-lined stainless steel autoclave to which 40 ml of a 1 M aqueous NaOH solution is added. The autoclave is then placed within an oven at 220° C. for durations ranging from 4-60 h, resulting in the growth of single crystal sodium titanate ($Na_2Ti_2O_5.H_2O$) nanowires oriented perpendicular to the titanium foil substrate. The sample is then immersed in 30 ml of 0.6 M HCl solution for one hour to exchange $Na^+$ with $H^+$ ions, resulting in protonated bi-titanate ($H_2Ti_2O_5.H_2O$) nanowires. The sample is removed from the HCl solution and thoroughly rinsed with deionized water or ethanol and dried under ambient conditions. The sample is then furnace annealed at 650° C. for 2 h. The uniform diameter of the individual nanowires indicate that they grow through epitaxial addition of growth units, which Liu et al. suggest are most likely $TiO_6$ octahedra, to the top of the nanowire.

Since the titanium foil substrate effectively represents an infinite source for nanowire source material, Liu et al. teach that increasing the hydrothermal reaction time results in increased nanowire length until depletion of the NaOH solution at approximately 48 h, beyond which continued growth of nanowire length can be achieved with addition of fresh NaOH solution. Increasing the hydrothermal growth time increases both the nanowire length and nanowire diameter. For 1 M NaOH solution a hydrothermal growth time of 6 h results in nanowires 12 μm long and 12 nm diameter; a growth time of 12 h results in nanowires 19 μm long and 26 nm diameter; a 18 h growth time results in nanowires of 22 μm length and 36 nm diameter; a 24 h growth results in nanowires 26 μm long and 47 nm diameter. Hydrothermal growth solutions of higher NaOH molarity results in smaller diameter nanowires.

The nanowire array films described by Liu et al. are single crystal anatase and can be made several tens of microns in length, which are extremely desirable properties for use in dye sensitized solar cells, as well as other $3^{rd}$ generation solar cell designs such QD and MEG devices. However, those films are grown from an opaque titanium foil substrate. Such films can only be utilized under so-called 'back-side' illumination; in the case of dye sensitized solar cells this requires the incident light to pass through the redox electrolyte before reaching the dye layer. Since the redox electrolyte absorbs light without the photogeneration of charge the resulting device photoconversion efficiencies are always significantly less than those devices illuminated through the photoanode. Further, high temperature annealing of the titanium sample, necessary for achieving the anatase $TiO_2$ nanowires, results in growth of a rutile barrier layer separating the nanowire film from the underlying titanium substrate. When integrated into a photovoltaic solar cell, this rutile barrier layer serves to increase the series resistance of the device in turn decreasing the device photoconversion efficiency.

It is desirable to provide an improved self-assembling, vertically-oriented 1-D nanostructure comprised of crystalline structural elements that are synthesized upon a transparent conductive substrate for use in photovoltaic and other applications.

SUMMARY OF THE INVENTION

The present invention relates to fabrication of films comprised of single crystal, anatase $TiO_2$ nanowire arrays that are grown vertically oriented from a substrate. While the nanowires can be grown upon a variety of surfaces, including metals, preferably the anatase nanowire films can be directly grown on transparent conductive oxide ("TCO") coated substrates. The nanowires can be used in third generation photovoltaic designs, such as dye sensitized solar cells. The synthesis technique does not harm the TCO layer, such as fluorine-doped $SnO_2$ ("FTO"). The high surface area crystalline anatase nanowire films offer enhanced light absorption without a corresponding penalty in unwanted charge recombination, and as such offer great utility in a variety of $3^{rd}$ generation photovoltaic designs, including dye sensitized, quantum dot, and multiple exciton solar cells.

The present invention provides a synthesis technique whereby 1-D anatase nanowire films: 1) can be obtained in a cost effective manner, without damage to the underlying transparent conductive layer to minimize series resistance, 2) that are fully crystalline for superior charge transport, and 3) that are of extended length for enhanced light absorption.

The invention will be more fully described by reference to the following drawings.

DETAILED DESCRIPTION OF THE INVENTION

Figure 1:
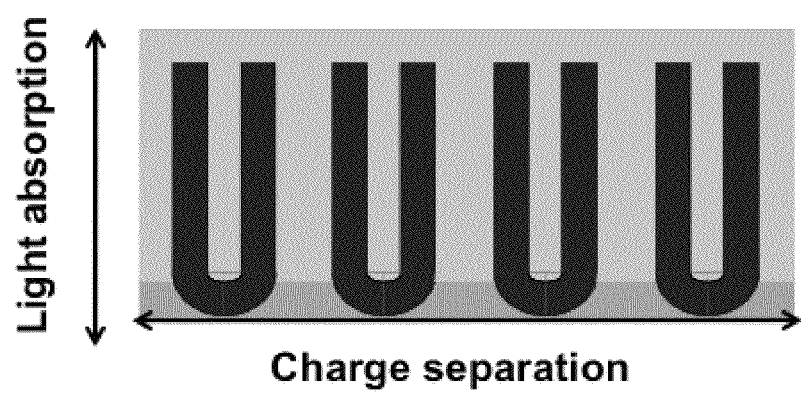
FIG. 1 is a schematic illustration of a prior art one-dimensional ("1-D") material architecture for photovoltaic use.

Reference will now be made in greater detail to a preferred embodiment of the invention, an example of which is illustrated in the accompanying drawings. Wherever possible, the same reference numerals will be used throughout the drawings and the description to refer to the same or like parts.

With third generation photovoltaics, a key design parameter is orthogonalization of light absorption and charge separation, achieved through use of a vertically oriented one-dimensional ("1-D") material architecture, see FIG. 1. For $3^{rd}$ generation photovoltaic designs the one dimensional (1-D) design of FIG. 1 offers significantly improved performance, with the direction of light absorption (ideally absorption layers would be several tens of microns in thickness) orthogonal to the direction of charge separation (on a scale of a few nanometers). With such a 1-D design comprised of crystalline structural elements that facilitate charge transfer, light absorption can be increased as desired without a penalty in charge recombination since the crystalline structures, in particular crystalline anatase $TiO_2$, rapidly transport the charge to the underlying electrical contact without unwanted recombination of the photogenerated charge.

Light absorption is more fully achieved with thicker layers of light absorbing material since there is no perfect light absorber. However, thicker layers generally result in slower or less efficient charge separation that in turn leads to unwanted charge recombination. Hence the orthogonalization of light absorption and charge transfer would offer a great opportunity for a significant advance in photovoltaic technology. This trade-off between light absorption and efficient charge transfer has limited the nanoparticle-based photoanode thickness of conventional DSSC designs to approximately ten microns. Although a thicker photoanode layer enables greater light absorption, any benefit obtained with increased light absorption is offset by increased recombination of the photogenerated charges.

In an embodiment of the present invention, anatase nanowire array films are synthesized from dense titania films, amorphous, rutile, anatase or a mixture of the phases, coated in various embodiments onto the surface of a transparent conductive substrate for use in solar cells. In one embodiment, a transparent conductive oxide layer is coated onto glass. Indium-doped $SnO_2$ ("ITO") is a suitable TCO layer coated onto glass for solar cell use, as is fluorine-doped $SnO_2$ ("FTO"). For example, the TCO layer can be comprised of one or more oxides, such as may be selected from the group consisting of tin oxide ("$SnO_2$"), ITO, and FTO. The substrate can be flat. Alternatively, the substrate can be a cylinder, sphere, polyhedron, honeycomb, lattice structures, and a structure with irregular dimensions. The substrate can be flexible. The substrate can be comprised of or coated with graphene, or other material comprised at least in part of carbon. The substrate can be modified for chemical and/or physical resistance. It will be appreciated that in accordance with the teachings of the present invention, the nanowire synthesis technique is not limited to a specific transparent, transparent conductive or other substrate.

A variety of ways to deposit dense titania films onto a substrate can be used in the present invention, including reactive sputtering of a Ti target, reactive evaporation, doctor blading followed by mechanical compression, screen printing, cathodic deposition, dip coating, and electroporetic deposition or the like and combinations thereof. The deposition technique is not restricted to a specific means for deposition onto the substrate.

Nanowire arrays including wire diameters about 10 nm to about 15 nm are synthesized from the titania film under hydrothermal conditions using a solvent. For example, the solvent can be an aqueous NaOH, KOH, RbOH $Ca(OH)_2$ and $NH_4OH$ solution. The solvent molarity is in the range of about 0.5 M to about 18 M. The thicker the starting titania layer the longer the resulting nanowires will be, while a thinner starting titania layer will result in shorter nanowires. The greater the density of the starting $TiO_2$ film, deposited on the TCO, the greater the density of the resulting nanowire array; a porous starting film will convert to fewer nanowires with greater wire-to-wire spacing. It is known that a photoanode comprised of a dense nanowire array will have a larger surface area than a photoanode comprised of a sparse nanowire array.

Figure 2:
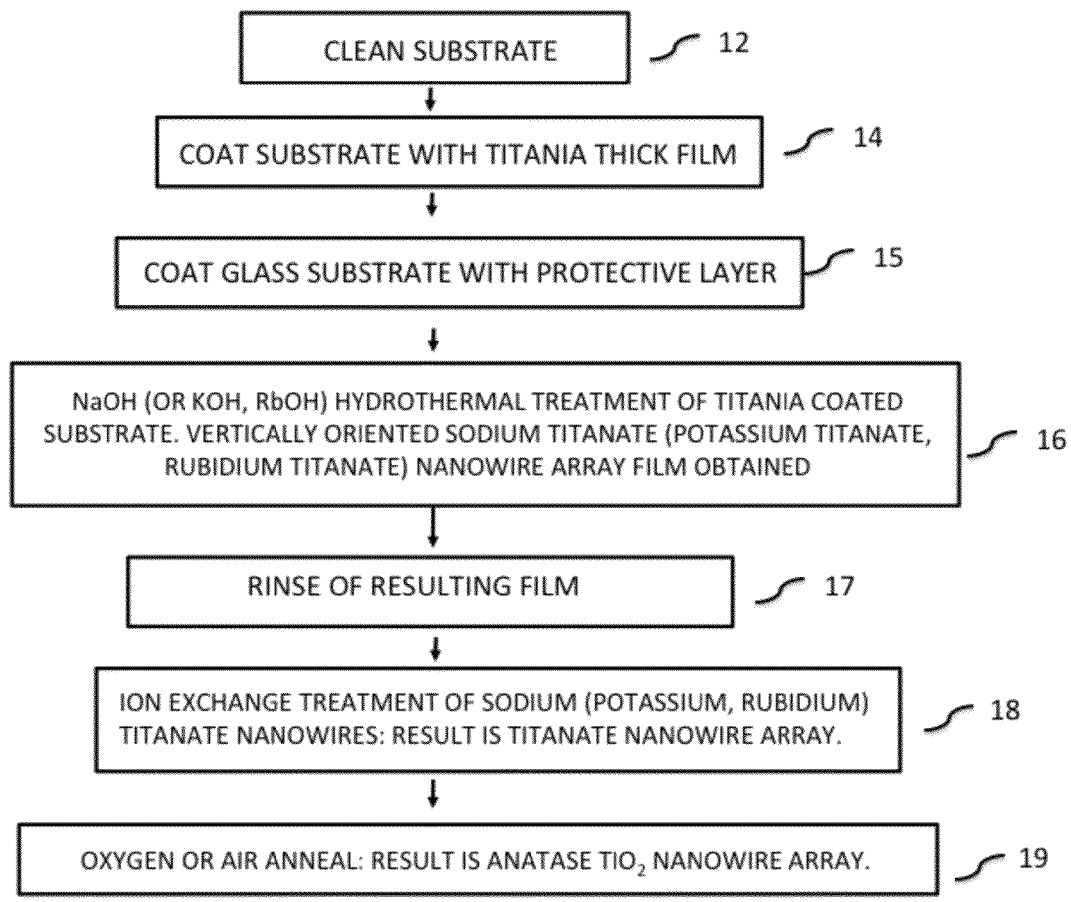
FIG. 2 is a flowchart of anatase nanowire array fabrication process in accordance with the teachings of the present invention.

FIG. 2 is a flowchart of a preferred embodiment of the anatase nanowire array fabrication method 10 in accordance with the teachings of the present invention.

While each individual step of the method is shown in FIG. 2 the steps can be incorporated and/or removed, the sequence of steps can be modified as desired. Further, one or more steps can be performed at the same time as and/or together with one or more other steps, and any or all steps may be performed continuously or in batch mode. Any or all steps may be performed multiple times and may be performed in any sequence of steps to iteratively produce the desired final nanowire array.

The present invention provides for completion of the following three steps: (1) deposition of titania on a substrate, (2)

conversion of the titania to a titanate, and (3) treatment to produce crystalline anatase nanowires. In a preferred embodiment, the final product is a crystalline anatase nanowire array upon a transparent conductive oxide-coated glass substrate, of particular interest in the photovoltaic field. Alternatively, the final product is a crystalline anatase nanowire array film upon a transparent substrate such as glass, of particular interest in the photocatalysis field.

As a first step of a preferred embodiment shown in block 12, a clean substrate is used to promote adhesion of the dense titania layer. The substrate can be comprised of one or more types of glass, metal, ceramic, fiber, and/or polymer. The substrate can be a TCO-coated glass substrate. The TCO layer is comprised of one or more oxides, as may be selected from the group consisting of $SnO_2$, ITO, and FTO. A glass substrate coated with a transparent, electrically conductive layer is advantageous for many uses, such as in photovoltaic and photocatalytic applications. For example, FTO-coated glass can be used in the present invention. As a typical cleaning step, the FTO-coated glass substrate, or double-sided FTO-coated glass substrate, is cleaned using an ultrasonic bath: isopropanol for about 5 min, acetone for about 5 min, methanol for about 5 min, and water for about 5 min, then dried under nitrogen flow. As an alternative cleaning method, the substrate can be sonicated in a NaOH saturated ethanol solution for five minutes, thoroughly rinsed with de-ionized water, then dried under a stream of inert gas such as nitrogen or argon. It will be appreciated that a variety of other cleaning procedures can be used with the teachings of the present invention.

In block 14, the substrate is coated with a titania film. The titania film can be amorphous, rutile, anatase, or a mixture of phases. Different routes can be used for depositing a thick titania film on the substrate. The film deposition technique is not critical nor is the composition of the starting dense titania layer. Electroporetic deposition can be used for deposition of thin or thick films, up to approximately 20 μm in thickness, on a variety of substrates including TCO-coated glass, as described in Matthews et al. (D Matthews, A. Kay, M. Gratzel, *Electrophoretically Deposited Titanium Dioxide Thin Films for Photovoltaic Cells*, Australian J. Chem. 1994, 47, 1869-1877; and, L. Grinis, S. Dor, A. Ofir, A. Zaban, *Electrophoretic deposition and compression of titania nanoparticle films for dye-sensitized solar cells*, J. Photochemistry and Photobiology A: Chemistry 198 (2008) 52-59, each of which are hereby incorporated by reference into this application). Electroporetic deposition, as well as deposition through dip-coating, is achieved through use of a titania solution. A titania solution is prepared using a solvent. Example solvents include acetylacetone, acetone, butanone, pentanone, hexanone, or any other ketone can be substituted. It will be appreciated that a variety of solvents can be used over a range of concentrations. With electroporetic deposition, the desired thickness is achieved through control of the titania solution concentration, applied voltage, and number of deposition steps. With dip-coating, the desired thickness of the starting dense titania film can be achieved through multiple dip-coating/annealing steps. With dip-coating, after deposition of each film layer it is advantageous to anneal the film to eliminate residual solvent and organic residue. This is achieved through heating of the sample to an elevated temperature, a few hundred degrees Celsius, for a duration of at least a few minutes. Any annealing or similar process to eliminate residual solvent and organic residue can be used to the same effect, for example rapid thermal (flash) annealing, IR annealing, thermal oven, hot plate, microwave oven and the like. A final annealing step after deposition of a film of desired thickness can be used to enhance film densification and remove any residual organics. For example, an oxygen or air anneal of the film at about 500° C. to about 550° C. for about 1 h to about 3 h can be used, with the higher temperature and longer duration resulting in a denser film.

In block 15 of a preferred embodiment, the glass substrate is coated with a protective coating to prevent damage to it from the solvents used to convert the dense titania film to nanowires. For example, the use of hydroxide solvents to that end will etch glass much more rapidly than the TCO coatings. Etching of the glass substrate upon which the TCO coating and nanowire film rest is deleterious for photovoltaic use, since much of the light incident upon the glass is scattered away from the solar cell due to specular reflection. Consequently, it is necessary to protect the glass substrate prior to hydrothermal treatment with such solvents. In one embodiment, the TCO coating is placed on both sides of the glass substrate. Double-sided TCO-coated substrates enable nanowire growth on both sides of the substrate; the nanowire array films on each side of the glass substrate could be made into solar cells or, alternatively, the nanowire film on one side can be used within the solar cell, the nanowire film on the other side serves as an anti-reflection coating. In another embodiment, the glass can be protected through use of a spin-on, evaporated, sputtered, spray-coated, or painted on film such as Polytetrafluoroethylene ("PTFE", aka Teflon™), poly(methyl methacrylate) (PMMA) dissolved in acetone, photoresist, a layer of sputtered metal or metals, such as Pt or Ni, or a sacrificial layer of spin-on glass or such other materials as are known in the art. If the titania film is applied via dip-coating, then both sides of the substrate will be coated with titania, hence the alkali protective coating will be deposited onto the titania coating that covers the glass surface of the substrate. If the titania film is deposited such that only one side of the substrate is coated, for example, electrodeposition or sputtering, then the protective coating is deposited directly onto the glass substrate.

In block 16 of a preferred embodiment, the titania-coated substrate is subjected to hydrothermal treatment to convert the dense titania layer into a nanowire array. The titania thick film can be converted into a nanowire array, vertically oriented from the substrate, by hydrothermal treatment using a solvent which may be selected from NaOH, KOH, LiOH, $NH_4OH$ or RbOH, or mixtures thereof. For example, NaOH hydrothermal treatment can be used to provide a vertically oriented $Na_2TiO_4$ nanowire array. Alternatively, other hydroxide compounds can be used in hydrothermal treatment. The reactor used for nanowire formation can be comprised of a single or plurality of vessels, devices or the like operated in a batch or continuous manner, and heated by conductive, convective or radiant means, such as a thermally-heated hydrothermal reactor or a microwave-heated hydrothermal reactor. The reactor can also incorporate one or more methods that facilitate dispersion or reaction of reactants, such as electrification, sonication, sparging, circulation, agitation or mixing. In a preferred embodiment, the titania film-coated substrate is placed within a reactor containing NaOH, KOH, LiOH, RbOH or $NH_4OH$, or mixtures thereof within a molarity range of about 1 M to about 18 M, and heated within a range of temperatures, about 120° C. to about 340° C., for a duration ranging from about 0.25 h to about 48 h, to convert the dense titania film into a nanowire array vertically oriented from the substrate. It is recognized that there is a balance between starting film density and thickness, between growth solution molarity and type, and between temperature and duration balance. For a 20 μm thick dense titania film, at about 5 M NaOH, about 200° C. for about 2 h duration, only approximately 10% of the dense nanoparticle film is converted into nanowires, while 100% nanoparticle to nanowire conversion efficiency can be obtained for the same time and temperature at 10 M. However, in general, with a further increase in solution molarity beyond about 10 M the nanoparticle to nanowire conversion efficiency decreases because the newly formed nanowires will be re-dissolved. It is recognized that a less dense titania film is more prone to conversion by the solution. The optimal molarity depends upon the solvent, for example with KOH at about 200° C. 2 h 18 M can be used to fully obtain nanowire array films. Microwave-driven hydrothermal synthesis can be used for nanowire growth, significantly reducing the required processing time. Depending upon the size of the reactor, microwave power can be tailored to readily promote conversion of the nanoparticle film to a nanowire film. Depending upon the film thickness and molarity of the solvent used, microwave power levels can be used from about 50 W to about 5,000 W, with reactions times from about 30 s to about 6 h.

In block 17 the nanowire film, removed from the hydrothermal treatment, is rinsed in de-ionized water, or other suitable rinsing agent such as ethanol, acetone, ionic liquids, or cleaned in a stream of inert gas, to remove the residual alkali solution. This washing step is a generally preferred processing step, as typically without this washing step, when the nanowire films are subjected to the ion treatment, block 18, the nanowires collapse to particles and fall from the film.

In block 18, the nanowire array is treated with an acid, such as HCl or $HNO_3$, but the technique is general to other acids such as $H_2SO_4$, $H_2SO_3$, $HClO_4$, and the like. In the presence of NaOH aqueous solution during nanowire growth, for example, some of the Ti—O—Ti bonds are broken with Ti—O—Na and Ti—OH bonds formed. In treating the film with acid, for example HCl, the Ti—O—Na and Ti—OH bonds react with the acid and water to form new Ti—O—Ti bonds. In the case of NaOH treatment, for example, the resulting sodium titanate $Na_2TiO_4$ nanowires can be treated with HCl or $HNO_3$, etc. solution to provide a titanate $H_2TiO_3$ nanowire array. The acids can be used singularly or in combination with molarities ranging from about 0.01 M to about 5 M, or about 0.01 M to about 1 M with immersion times from about 10 min to about 72 h, or about 10 min to about 24 hours with either a single, prolonged immersion step or multiple shorter immersion steps. It is noted that although alkali hydroxides other than sodium can be used, such as RbOH, there will still be some sodium titanate bonds within the film due to leaching of sodium from the glass substrate.

Figure 3:
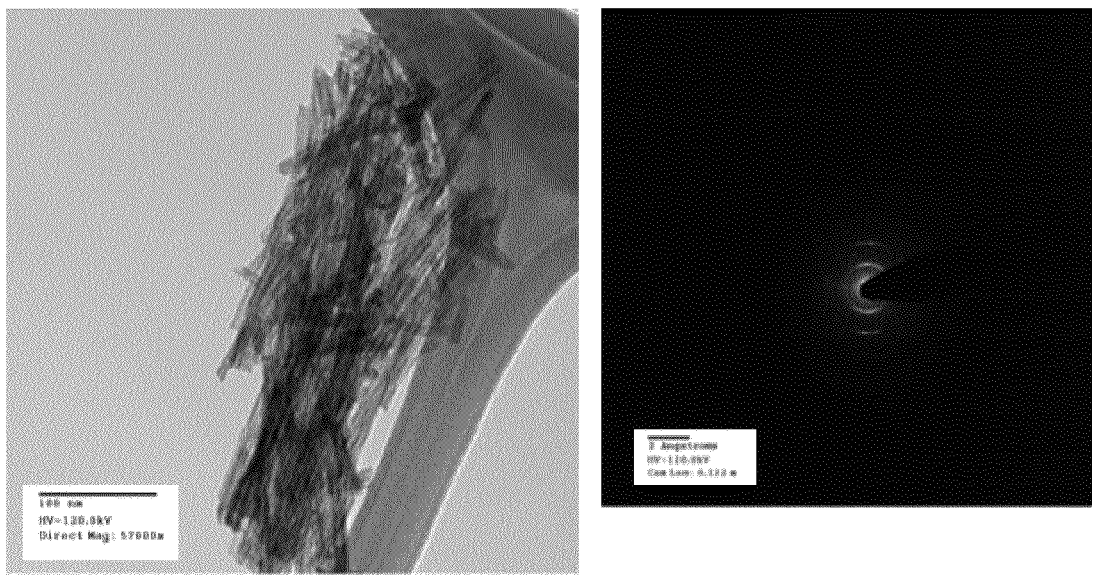
FIG. 3 is a TEM and selected area diffraction pattern of synthesized anatase nanowires.
Figure 4:
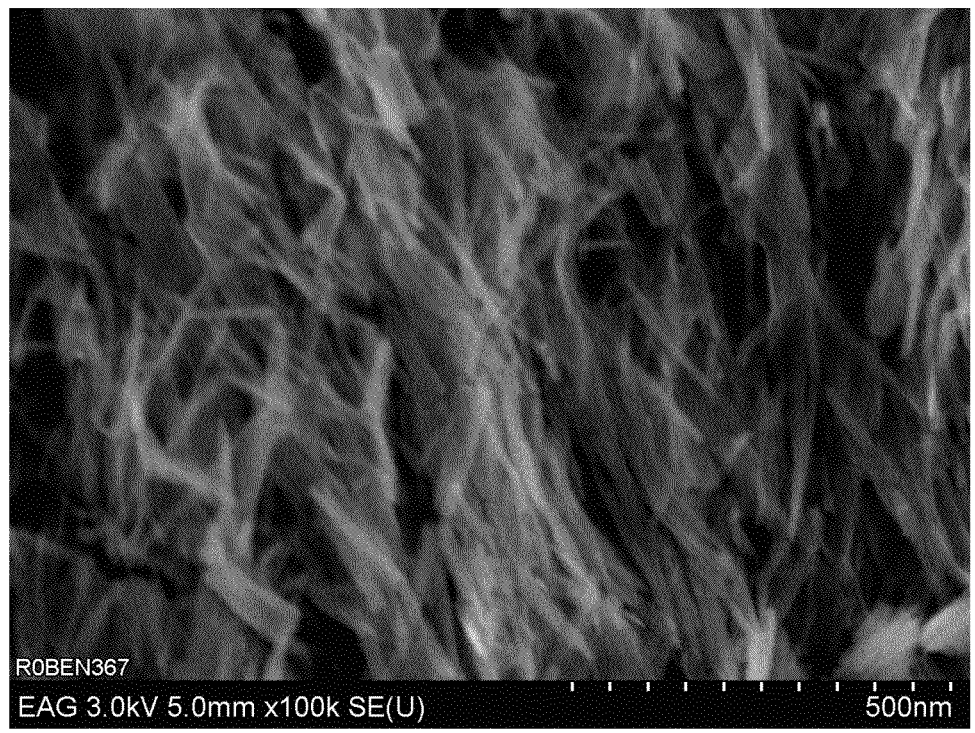
FIG. 4 is a FE-SEM image of anatase nanowire arrays on FTO-coated glass substrate.

In block 19, the titanate nanowire array film is annealed in the presence of gas, including oxygen, ambient air or the like, for conversion to anatase $TiO_2$. The annealing step is conducted before, during or after acid immersion. Any annealing process can be used to the same effect, for example rapid thermal (flash) annealing, infrared (IR) annealing, thermal oven, hot plate, microwave oven and the like. An additional quenching step may be incorporated. An oxygen or air anneal is used to convert the titanate nanowire array into an anatase $TiO_2$ nanowire array, as shown in FIG. 3 and FIG. 4. A variety of time and temperatures can be used to anneal the nanowire away, in accordance with the teachings of the present invention. A suitable range of annealing temperatures, for example, about 225° C. to about 600° C., and durations ranging from about 0.01 h to about 48 h or can be used in the present invention. For example, the nanowire array can be air annealed at about 500° C. for about 2 h. A small nanowire diameter, about 10 nm to about 15 nm, prevents their conversion to rutile.

The deposition, conversion and/or treatment steps can include the introduction of one or more dopants, or mixtures thereof, that shift the bandgap energy of the final anatase nanowire array. Such dopant or dopants can be selected from a group consisting of Ag, Al, As, Au, Bi, C, Cd, Co, Cu, Fe, Ga, Ge, In, Ir, N, Ni, Pb, Pd, Pt, Rh, Sb, Si, Sn, Ta, Tl, W, and Zn.

The deposition, conversion and/or treatment steps can include the intercalation of one or more organic and/or inorganic p-type semiconductors within the nanowire arrays (the nanowire arrays being n-type semiconducting anatase); the introduction of one or more dyes; and/or the intercalation of quantum dots, of one or more sizes, and of one or more compositions, with or without the use of one or more other materials for absorption of radiation, to sensitize the final anatase nanowire array for absorption of radiation.

The final crystalline anatase nanowire arrays produced by the inventive method can be used in a device to produce electricity, or a device to catalyze and/or promote chemical reactions. The nanowire array can be used as one or more electrodes within an energy storage device, including battery devices based upon use of lithium or other ions, such as Al, Mg, Na, Zn and the like.

The invention can be further illustrated by the following examples thereof, although it will be understood that these examples are included merely for purposes of illustration and are not intended to limit the scope of the invention unless otherwise specifically indicated. All percentages, ratios, and parts herein, in the Specification, Examples, and Claims, are by weight and are approximations unless otherwise stated.

Titania Thick Film Deposition on TCO-Coated Glass

Example 1

A dip-coating of the TCO-coated glass substrate in a $TiO_2$ sol is used for deposition of the dense titania layer from which the anatase nanowire array will be fabricated. A $TiO_2$ sol was made by dissolving 3 ml titanium tert-butoxide in 7 ml ethanol. For film deposition, the TCO-coated substrate was dipped into the sol, removed, then heated to evaporate the solvent, remove any organic materials on the surface, and promote densification of the deposited film (sintering of the multiple layers into one dense layer). In this example, the substrate was annealed after each sol-dipping step at 450° C. for 10 min Each dip-coating step resulted in an incremental film increase of approximately 100 nm, therefore for a desired starting thickness of 1 μm, ten dip-coating/annealing steps were used. Using a greater titanium butoxide sol concentration will give an incrementally thicker layer with each dip-coating. Using dip-coating, several micron thick titania films onto FTO-coated glass substrates were successfully deposited with using $TiO_2$ sols comprised of 0.3 ml to 3 ml titanium butoxide dissolved into 7 ml ethanol. After this step, a protective Teflon coating was sprayed onto titania layer covering the back (non-TCO covered side) of the glass substrate.

$TiO_2$ Thick Film Deposition on TCO-Coated Glass

Example 2

A $TiO_2$ solution can be made using 0.1 g to 0.4 g of P25 nanoparticles in 10 ml of solvent which can be, for example, 3 ml titanium tert-butoixde in 7 ml ethanol. Solution dispersion is enhanced by stirring for an extended period, approximately 5-20 min. A FTO-glass substrate, immersed in the $TiO_2$ solution, was used as the cathode and a platinum foil used as an anode. The distance between these two electrodes was 3 cm. 4 V DC bias was applied between these two electrodes for 3 min or longer depending on the density of the precursor solution and the film thickness needed. After deposition of the several micron thick $TiO_2$ film, the substrate was taken out from the solution and annealed at 500° C. for 1 h to remove any residual organics. After this step, a protective Teflon coating was sprayed onto the back (non-TCO covered side) of the glass substrate.

$Na_2TiO_4$ Nanowire Array Fabrication by Hydrothermal Treatment of Titania Films Example 3

A FTO-glass substrate coated with a 12 μm thick dense titania layer was placed in a hydrothermal reactor containing 10 M NaOH for 2 h at 200° C. to convert the dense titania film into a 12 μm long $Na_2TiO_4$ nanowire array vertically oriented from the substrate. After removal from solution, the residual NaOH upon the surface of the film was removed by rinsing the sample in de-ionized water.

$Na_2TiO_4$ Nanowire Array Fabrication by Microwave Hydrothermal Treatment of Titania Films Example 4

For a microwave hydrothermal reactor of 100 ml size, the reactor was heated using a 300 W power setting for 0.5 h, 10 M NaOH, to convert a 4 μm thick titania film to a nanowire array film of the same length.

Conversion of the $Na_2TiO_4$ Nanowire Arrays to $H_2TiO_4$ Nanowire Arrays

Example 5

Sodium titanate nanowire array films were dipped, at room temperature, into a 0.2 M HCl or $HNO_3$ solution for 1 h for replacement of the sodium ions with hydrogen ions, forming titanate nanowires.

Final Annealing

Example 6

The $H_2TiO_4$ nanowire array film was annealed in oxygen to convert the $H_2TiO_4$ to anatase $TiO_2$ nanowires by subjecting the films to a 550° C. anneal for about 3 h. An air anneal can be used to the same effect.

Application of Anatase Nanowire Films to Third Generation Photovoltaics

Example 7

Figure 5:
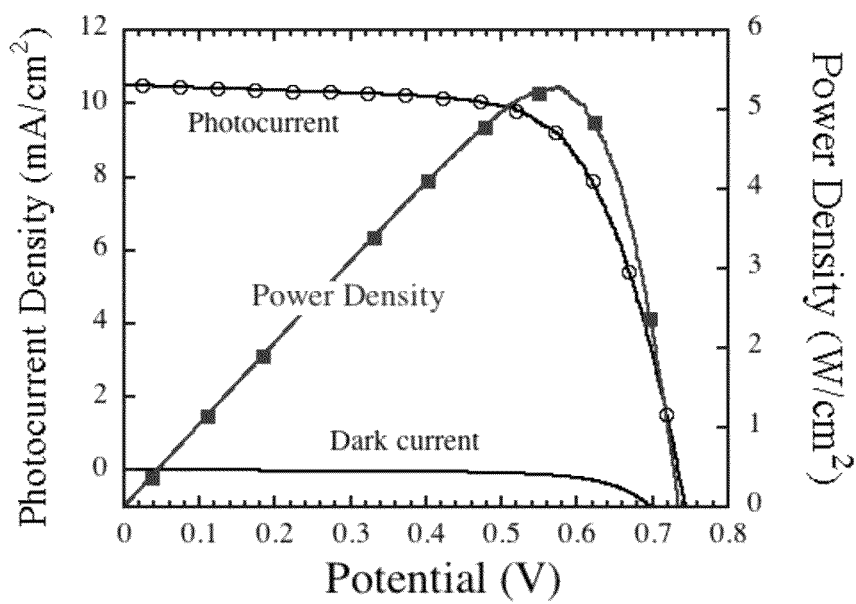
FIG. 5 illustrates photocurrent density voltage curves of anatase nanowire-based liquid junction dye sensitized solar cell, N-719 dye.
Figure 6:
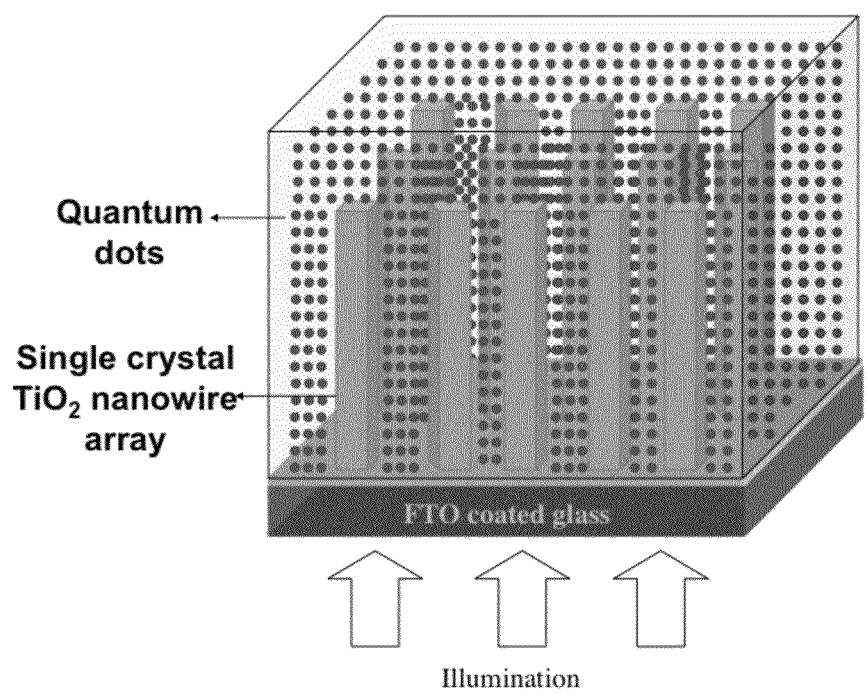
FIG. 6 is a schematic diagram illustrating the intercalation of the anatase nanowire array films with quantum dots.

FIG. 4 is a field emission scanning electron microscope image of a typical anatase $TiO_2$ nanowire array film grown on a FTO-coated glass substrate. The nanowires have a diameter of less than 10 nm and length of about 1.5 μm. In liquid dye-sensitized solar cells using N-719 dye, a power conversion efficiency of 5.27% has been achieved using nanowire arrays approximately 3.2 μm long, as shown in the photocurrent density voltage curves of FIG. 5. Taking into account the unwanted specular reflection of the incident light due to etching of the glass substrate, the efficiency of the device is much higher than that of a nanoparticle electrode of the same thickness. Since air is not trapped within a nanowire array film, as it is within a nanotube array film, the wires can be readily intercalated with quantum dots, as depicted in FIG. 6.

Application of Anatase Nanowire Films to Infrared-Driven Catalysis

Example 8

Figure 7:
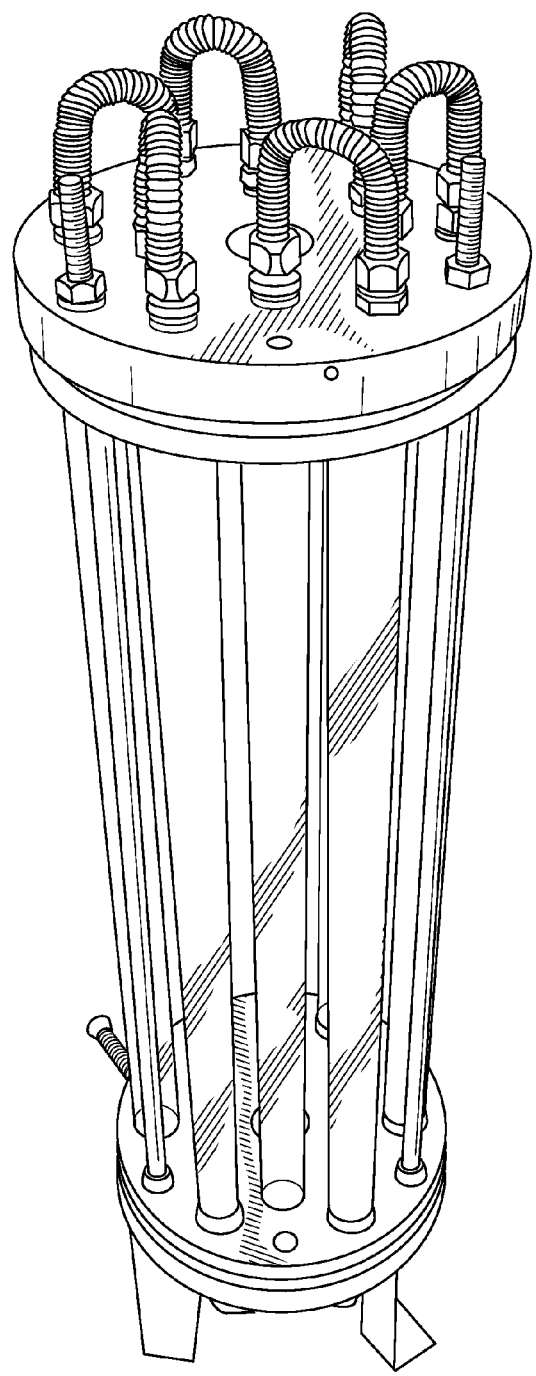
FIG. 7 is an illustrative photocatalytic reactor.

FIG. 7 is a photograph of a catalytic reactor; light incident upon the titania-containing glass tubes generate electron hole pairs, which then convert chemical compounds passing through the tubes. The $TiO_2$ nanowire arrays are grown on the inside of the tubes, or both inside and outside of tubes placed concentrically within an outer sleeve, over which the chemical agents pass and are converted as described, for example, by S. C. Roy, O. K. Varghese, M. Paulose, and C. A. Grimes, *Toward Solar Fuels: Photocatalytic Conversion of Carbon Dioxide to Hydrocarbons*, ACS Nano 4 (2010) 1259-1278. As an illustrative, but limiting example application, integration of the anatase $TiO_2$ nanowire arrays with infra-red (IR) harvesting compounds, such as quantum dots as described by Steven A. McDonald, Gerasimos Konstantatos, Shiguo Zhang, Paul W. Cyr, Ethan J. D. Klem, Larissa Levina and Edward H. Sargent, *Solution-processed PbS quantum dot infrared photodetectors and photovoltaics*, Nature Materials 4, 138-142 (2005), enables fabrication of catalytic devices driven by thermal energy.

It is to be understood that the above-described embodiments are illustrative of only a few of the many possible specific embodiments, which can represent applications of the principles of the invention. Numerous and varied other arrangements can be readily devised in accordance with these principles by those skilled in the art without departing from the spirit and scope of the invention.

The invention claimed is:

1. A method of growing crystalline anatase nanowires upon a substrate comprising the steps of:
   deposition of a layer of titania onto a substrate;
   conversion of the layer of titania into titanate nanowires; and,
   treatment of the titanate nanowires to produce crystalline anatase nanowires.

2. The method of claim 1 wherein one or more reactors are used in one or more steps, simultaneously and/or sequentially, and in a continuous and/or batch manner.

3. The method of claim 2 wherein one or more reactors are heated within a range of temperatures including about 120° C. to about 340° C.

4. The method of claim 2 wherein one or more reactors are heated for a duration ranging from about 0.25 h to about 48 h.

5. The method of claim 2 wherein at least one of the reactors is a hydrothermal reactor.

6. The method of claim 2 wherein at least one of the reactors is a microwave-driven hydrothermal reactor.

7. The method of claim 6 wherein a range of microwave power levels in the microwave-driven hydrothermal reactor are used between about 50 W and about 5,000 W.

8. The method of claim 6 wherein a range of microwave-driven reaction times in the microwave-driven hydrothermal reactor treatment is used between about 30 and about 6 h.

9. The method of claim 1 in which one or more solvents are used, either simultaneously or sequentially.

10. The method of claim 9 in which the solvent is comprised at least in part of one or more hydroxides, which are be selected from the group consisting of NaOH, KOH, LiOH, RbOH, Ca(OH)$_2$ and NH$_4$OH, to produce a nanowire composition containing the alkali ion of the hydroxide used.

11. The method of claim 9 wherein the solvent molarity is in the range of about 0.5 M to about 18 M.

12. The method of claim 1 wherein the treatment step includes immersion of the titanate nanowires in an acid solution.

13. The method of claim 12 wherein the acid solution is of the molarity range of about 0.01 M to about 5 M.

14. The method of claim 12 wherein the resulting nanowire array is immersed in the acid solution for a duration between about 10 min to about 24 h.

15. The method of claim 1 wherein the treatment step includes annealing of the titanate nanowires.

16. The method of claim 15 wherein the annealing step is completed in the presence of gas.

17. The method of claim 16 wherein the gas utilized in the annealing step is comprised at least in part of oxygen wherein the anatase nanowires are anatase TiO$_2$ nanowires.

18. The method of claim 15 in which the annealing step is conducted before, during or after acid immersion.

19. The method of claim 15 wherein the nanowires are annealed at temperatures ranging from about 225° C. to about 600° C.

20. The method of claim 15 wherein the nanowires are annealed for durations ranging from about 0.1 h to about 48 h.

21. The method of claim 1 wherein the substrate is comprised of one or more types of glass, metal, ceramic, fiber, and/or polymer.

22. The method of claim 1 in which the crystalline anatase nanowires are grown upon one or both sides of the substrate, the substrate being flat.

23. The method of claim 1 in which the crystalline anatase nanowires are grown upon one or more sides of the substrate, where the substrate is a three dimensional structure, the structure constructed in the form of a cylinder, sphere, polyhedron, honeycomb, lattice, or other structures with regular or irregular dimensions.

24. The method of claim 1 in which the substrate is flexible.

25. The method of claim 1 wherein the substrate is comprised of or coated with graphene, or other material comprised at least in part of carbon.

26. The method of claim 1 wherein the substrate is coated on one or more sides with a transparent conductive oxide ("TCO") layer.

27. The method of claim 26 in which the TCO layer is comprised of one or more oxides, which are selected from the group consisting of tin oxide ("SnO$_2$"), indium-doped tin oxide ("ITO"), and fluorine-doped tin oxide ("FTO").

28. The method of claim 1 wherein the substrate is modified for chemical and/or physical resistance.

29. The method of claim 1 wherein the substrate is coated on at least one side with a protective layer, which protective layer may be comprised of Polytetrafluoroethylene ("PTFE"), poly(methyl methacrylate) ("PMMA") dissolved in acetone, photoresist, a layer of sputtered metal or metals, a sacrificial layer of spin-on glass, or other like protective layer.

30. The method of claim 1 in which one or more of the deposition, conversion and/or treatment steps includes the introduction of one or more dopants, or mixtures thereof, that shift the bandgap energy of the final anatase nanowire array.

31. The method of claim 30 wherein the dopant or dopants are selected from the group consisting of Ag, Al, As, Au, Bi, C, Cd, Co, Cu, Fe, Ga, Ge, In, Ir, N, Ni, Pb, Pd, Pt, Rh, Sb, Si, Sn, Ta, Tl, W, and Zn.

32. The method of claim 1 in which one or more of the deposition, conversion and/or treatment steps includes the introduction of one or more dyes to sensitize the final anatase nanowire array for absorption of radiation.

33. The method of claim 1 in which one or more of the deposition, conversion and/or treatment steps includes the intercalation of quantum dots, of one or more sizes, and of one or more compositions, with or without the use of one or more dyes or other material for absorption of radiation, to sensitize the final anatase nanowire array for absorption of radiation.

34. The method of claim 1 in which one or more of the deposition, conversion and/or treatment steps includes the intercalation of one or more p-type semiconductors within the nanowire arrays, the nanowire arrays being n-type semiconducting anatase.

35. The method of claim 34 wherein the p-type semiconductor is inorganic and/or an organic material, such as a polymer.

36. The method of claim 1 in which any of the deposition, conversion and/or treatment steps, or any aspect of such steps, are completed in one or more steps, in any sequence, at the same time as and/or together with one or more other steps, in a continuous or batch manner, and/or multiple times to iteratively produce the desired final crystalline anatase nanowire array.

37. The method of using the crystalline anatase nanowire array of claim 1 to produce electricity.

38. A device comprised at least in part of the crystalline anatase nanowire array of claim 1 for use in the production of electricity from radiation.

39. The method of using the crystalline anatase nanowire array of claim 1 to catalyze and/or promote chemical reactions.

40. A device comprised at least in part of the crystalline anatase nanowire array of claim 1 for use in the catalysis and/or promotion of chemical reactions with radiation.

41. The method of using the crystalline anatase nanowire array of claim 1 in an energy storage device.

42. A device for energy storage in which one or more electrodes is comprised at least in part of the crystalline anatase nanowire array of claim 1.

* * * * *